(12) United States Patent
Benkendorfer et al.

(10) Patent No.: US 12,438,015 B2
(45) Date of Patent: Oct. 7, 2025

(54) STAMPS WITH STRUCTURED MICROPOSTS

(71) Applicant: X-Celeprint Limited, Dublin (IE)

(72) Inventors: Kyle Bryant Benkendorfer, Kinsale (IE); Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 647 days.

(21) Appl. No.: 17/554,310

(22) Filed: Dec. 17, 2021

(65) Prior Publication Data

US 2023/0197479 A1 Jun. 22, 2023

(51) Int. Cl.
*H01L 21/67* (2006.01)

(52) U.S. Cl.
CPC .............. *H01L 21/67144* (2013.01)

(58) Field of Classification Search
None
See application file for complete search history.

(56) References Cited

U.S. PATENT DOCUMENTS

| | | | |
|---|---|---|---|
| 7,622,367 B1 | 11/2009 | Nuzzo et al. | |
| 7,927,976 B2 | 4/2011 | Menard | |
| 7,943,941 B2 | 5/2011 | Shimizu et al. | |
| 8,039,847 B2 | 10/2011 | Nuzzo et al. | |
| 8,506,867 B2 | 8/2013 | Menard | |
| 8,722,458 B2 | 5/2014 | Rogers et al. | |
| 8,889,485 B2 | 11/2014 | Bower | |
| 9,412,727 B2 | 8/2016 | Menard et al. | |
| 9,704,821 B2 | 7/2017 | Meitl et al. | |
| 10,189,243 B2 | 1/2019 | Menard et al. | |
| 10,252,514 B2 | 4/2019 | Bower et al. | |
| 10,438,859 B2 * | 10/2019 | Cok | H01L 24/98 |
| 10,714,374 B1 * | 7/2020 | Cok | H01L 33/0095 |
| 10,717,267 B2 | 7/2020 | Menard et al. | |
| 10,804,880 B2 * | 10/2020 | Cok | H03H 3/02 |
| 10,899,067 B2 | 1/2021 | Moore et al. | |
| 11,062,936 B1 | 7/2021 | Moore et al. | |
| 2008/0117362 A1 * | 5/2008 | Wolk | G02F 1/133606 445/24 |
| 2019/0006180 A1 * | 1/2019 | Kim | B41K 3/24 |
| 2021/0039380 A1 | 2/2021 | Cok | |
| 2021/0193500 A1 * | 6/2021 | Moore | H01L 21/67706 |
| 2021/0300098 A1 | 9/2021 | Moore et al. | |

FOREIGN PATENT DOCUMENTS

TW 200417745 A * 9/2004

* cited by examiner

*Primary Examiner* — Michael Lebentritt
(74) *Attorney, Agent, or Firm* — Choate, Hall & Stewart LLP; Michael D. Schmitt

(57) ABSTRACT

A stamp includes a rigid support and an array of posts disposed in combination with the rigid support. Each of the posts in the array of posts extends in a direction away from the rigid support. The distal end of each of the posts in the array of posts has a structured three-dimensional surface including a first micro-post that extends a first distance away from the rigid support and a second micro-post that extends a second distance away from the rigid support. The second distance is less than the first distance.

20 Claims, 16 Drawing Sheets

STAMPS WITH STRUCTURED MICROPOSTS

TECHNICAL FIELD

The present disclosure generally relates to micro-transfer printing stamps and stamp structures.

BACKGROUND

Substrates with electronically active components distributed over the extent of the substrate are used in a variety of electronic systems, for example, in flat-panel display components such as flat-panel liquid crystal or organic light emitting diode (OLED) displays, in imaging sensors, and in flat-panel solar cells. The electronically active components are typically either assembled on the substrate, for example using individually packaged surface-mount integrated-circuit components and pick-and-place tools, or by coating a layer of semiconductor material on the substrate and then photolithographically processing the semiconductor material to form thin-film circuits on the substrate. Individually packaged integrated-circuit components typically have smaller transistors with higher performance than thin-film circuits but the packages are larger than can be desired for highly integrated systems.

Methods for transferring small, active components from one substrate to another are described in U.S. Pat. Nos. 7,943,491, 8,039,847, and 7,622,367. In some such approaches, small integrated circuits are formed on a native semiconductor source wafer. The small, unpackaged integrated circuits, or chiplets, are released from the native source wafer by pattern-wise etching portions of a sacrificial layer located beneath the chiplets, leaving each chiplet suspended over an etched sacrificial layer portion by a tether physically connecting the chiplet to an anchor separating the etched sacrificial layer portions. A viscoelastic stamp is pressed against the process side of the chiplets on the native source wafer, adhering each chiplet to an individual stamp post. The stamp with the adhered chiplets is removed from the native source wafer. The chiplets on the stamp posts are then pressed against a non-native target substrate or backplane with the stamp and adhered to the target substrate.

In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane. Such micro-transferred components can provide the high performance of crystalline semiconductor components together with the small size of unpackaged dies.

Micro-transfer printing stamps are an important part of any micro-transfer printing system and method. Typically, each stamp comprises an array of individual stamp posts and each stamp post contacts a chiplet during printing. The structure of the stamp post can affect the chiplet pickup from a source wafer and the chiplet printing to a target substrate. In some designs, the distal end of each individual stamp post is flat. In other designs, the distal end of each individual stamp post is structured. For example, U.S. Pat. No. 9,412,727 discloses a stamp with micro-tips in a three-dimensional relief pattern. There is an ongoing need, therefore, for stamp structures that are highly reliable and easy-to-use for a variety of component micro-transfer printing processes.

SUMMARY

The present disclosure provides, inter alia, structures and methods for more efficiently micro-transfer printing components from a component source wafer to a target substrate with improved yields.

According to embodiments of the present disclosure, a micro-transfer-printing stamp comprises a rigid support and an array of posts disposed over the rigid support. Each of the posts in the array of posts extends in a direction away from the rigid support. For each post in the array of posts, a distal end of the post has a structured three-dimensional surface comprises a first micro-post that extends a first distance away from the rigid support and a second micro-post that extends a second distance away from the rigid support. The second distance is less than the first distance.

In some embodiments, the posts in the array of posts comprise an elastomeric material. In some embodiments, the micro-transfer-printing stamp comprises an elastomeric bulk layer disposed on the rigid support and the array of posts is disposed on the elastomeric bulk layer.

In embodiments of the present disclosure, the structured three-dimensional surface comprises a third micro-post that extends a third distance away from the rigid support, the third distance less than the second distance. In some embodiments, for each post in the array of posts, the structure three-dimensional surface of the post comprises a plurality of first micro-posts that extend at least the first distance away from the rigid support. The post can have an outer perimeter and a center, and the first micro-posts can be closer to the outer perimeter than to the center. The post can have an outer perimeter and a center, and the first micro-posts can be closer to the center than to the outer perimeter. The post can have an outer perimeter and the first micro-posts can be closer to the outer perimeter than to the second micro-post. The post can have an outer perimeter and a center and the first micro-posts can be disposed around the perimeter and the second micro-post can be disposed closer to the center than to the first micro-posts.

According to some embodiments, for each post in the array of posts, the structured three-dimensional surface comprises a plurality of second micro-posts that extend no more than the second distance away from the rigid support. The post can have an outer perimeter and a center, and the second micro-posts can be closer to the outer perimeter than to the center. The post can have an outer perimeter and a center, and the second micro-posts can be closer to the center than to the outer perimeter. The post can have an outer perimeter and the second micro-posts can be closer to the outer perimeter than the first micro-posts.

According to some embodiments, the first micro-post has a first shape and the second micro-post has a second shape, and the first shape can be different from the second shape. The first micro-post can have a first contact area and the second micro-post can have a second contact area, and the first contact area can be different from the second contact area.

In some embodiments, the first micro-post is no greater than fifteen microns longer (e.g., no greater than ten or than five microns longer) than the second micro-post.

Some embodiments comprise a respective component adhered to the first micro-post of each post in the array of posts.

According to some embodiments of the present disclosure, a source substrate system comprises a source substrate comprising a sacrificial layer comprising sacrificial portions separated by anchors and a micro-transfer-printing stamp.

Each of a plurality of components can be physically attached to an anchor of the anchors with a tether and can be disposed exclusively and directly over a sacrificial portion of the sacrificial portions. The components can be adhered to the first micro-post of posts in the array of posts.

According to some embodiments of the present disclosure, a target substrate system comprises a target substrate, components, and a micro-transfer-printing stamp. The components can be adhered to the target substrate, each of the components can comprises a broken (e.g., fractured) or separated tether, and the components can be adhered to first micro-post of posts in the array of posts.

According to some embodiments of the present disclosure, a method of micro-transfer printing comprises providing a source wafer comprising a sacrificial layer comprising a sacrificial portion adjacent to an anchor and a component physically attached to the anchor with a tether, the component disposed exclusively and directly over the sacrificial portion, providing a micro-transfer printing stamp, providing a target substrate, providing a printer operable to move at least the stamp with respect to (i) the source wafer and (ii) the target substrate, contacting the first micro-post and the second micro-post of one of the posts in the array of posts to the component by moving the stamp and the component together a picking distance with the printer to adhere the component to the first micro-post and to the second micro-post collectively with a first adhesion, removing the component from the source wafer with the printer, thereby breaking (e.g., fracturing) or separating the tether, allowing the first micro-post to relax such that the second micro-post separates from the component such that the component is adhered to the first micro-post with a second adhesion less than the first adhesion, and contacting the component to the target substrate by moving the stamp and the target substrate together a printing distance with the printer to adhere the component to the target substrate with a print adhesion greater than the second adhesion. The printing distance can be less than the picking distance. According to some embodiments, the component is removed from the source wafer at a first rate and methods of the present disclosure comprise removing the stamp from the component at a second rate less than the first rate such that the component remains on the target substrate.

According to some embodiments of the present disclosure, a method of micro-transfer printing comprises providing a source wafer comprising a sacrificial layer comprising a sacrificial portion adjacent to an anchor and a component physically attached to the anchor with a tether, the component disposed exclusively and directly over the sacrificial portion, providing a micro-transfer printing stamp, providing a target substrate, providing a printer operable to move the stamp with respect to the source wafer and to the target substrate, contacting the first micro-post and the second micro-post of one of the posts in the array of posts to the component by moving the stamp and the component together with the printer to adhere the component to the first micro-post and to the second micro-post, removing the component from the source wafer with the printer at a first rate, thereby breaking (e.g., fracturing) or separating the tether, contacting the component to the target substrate by moving the stamp and the target substrate together with the printer to adhere the component to the target, and removing the stamp from the component with the printer at a second rate less than the first rate such that the component remains on the target substrate. Removing the stamp from the component with the printer at a second rate less than the first rate can first detach the second micro-post from the component at a first time and can second detach the first micro-post from the component at a second time after the first time.

According to some embodiments of the present disclosure, a method of micro-transfer printing comprises providing a component disposed on a source wafer (e.g., a native source wafer) and a micro-transfer printing stamp, the stamp comprising a post comprising a distal end having a structured three-dimensional surface comprising one or more first micro-posts that protrude at least a first distance from the distal end and one or more second micro-posts that protrude no more than a second distance from the distal end, the second distance less than the first distance, contacting the one or more first micro-posts and the one or more second micro-posts of the post to the component by moving the stamp and the component together a picking distance to adhere the component to the one or more first micro-posts and to the one or more second micro-posts collectively with a first adhesion, removing the component from the source wafer while the component is adhered to the stamp, allowing the one or more second micro-posts to separate from the component such that the component is adhered to the one or more first micro-posts collectively with a second adhesion that is less than the first adhesion, and contacting the component to a target substrate by moving the stamp a printing distance to adhere the component to the target substrate with a print adhesion greater than the second adhesion. The printing distance can be less than the picking distance. Removing the component from the source wafer can comprise breaking (e.g., fracturing) or separating a tether physically connecting the component to the source wafer. The one or more second micro-posts can separate from the component due to relaxation of the one or more first micro-posts.

According to some embodiments of the present disclosure, a method of micro-transfer printing comprises providing a component disposed on a source wafer (e.g., a native source wafer) and a micro-transfer printing stamp, the stamp comprising a post comprising a distal end having a structured three-dimensional surface comprising one or more first micro-posts that protrude at least a first distance from the distal end and one or more second micro-posts that protrude no more than a second distance from the distal end, the second distance less than the first distance, contacting the one or more first micro-posts and the one or more second micro-posts of the post to the component by moving the stamp and the component together to adhere the component to the one or more first micro-posts and to the one or more second micro-posts, removing the component from the source wafer while the component is adhered to the stamp, contacting the component to the target substrate by moving the stamp and the target substrate together to adhere the component to the target, and removing the stamp from the component at a second rate less than the first rate such that the component remains on the target substrate. Removing the stamp from the component with the printer at a second rate less than the first rate can first detach the one or more second micro-posts from the component at a first time and can second detach the one or more first micro-posts from the component at a second time after the first time. Removing the component from the source wafer can comprise breaking (e.g., fracturing) or separating a tether physically connecting the component to the source wafer.

According to some embodiments of the present disclosure, a method of micro-transfer printing comprises providing a component disposed on a source wafer (e.g., a native source wafer) and a micro-transfer printing stamp, the stamp comprising a post comprising a distal end having a structured three-dimensional surface comprising one or more first micro-posts that protrude at least a first distance from the distal end and one or more second micro-posts that protrude no more than a second distance from the distal end, the second distance less than the first distance, picking up the component from the source wafer by, at least in part, pressing the post of the stamp to the component such that the one or more first micro-posts and the one or more second micro-posts temporarily adhere to the component, allowing the one or more second micro-posts to separate from the component such that the component is adhered to the one or more first micro-posts collectively with a second adhesion that is less than the first adhesion, and printing the component to a target substrate such that the stamp separates from the component and the component remains on the target substrate, wherein the one or more second micro-posts do not contact the component during the printing of the component to the target substrate.

According to some embodiments of the present disclosure, a method of micro-transfer printing comprises providing a micro-transfer printing stamp comprising a post comprising a distal end having a structured three-dimensional surface comprising one or more first micro-posts that protrude at least a first distance from the distal end and one or more second micro-posts that protrude no more than a second distance away from the distal end, the second distance less than the first distance, contacting the post of the stamp with a component such that the one or more first micro-posts and the one or more second micro-posts temporarily adhere to the component, and releasing the component from the stamp on a target substrate, wherein the one or more second micro-posts are not in contact with the component during the releasing.

Structures and methods described herein enable stamp structures and a release and printing process for micro-transfer printing components from a source wafer to a target substrate having improved yields and reliability.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
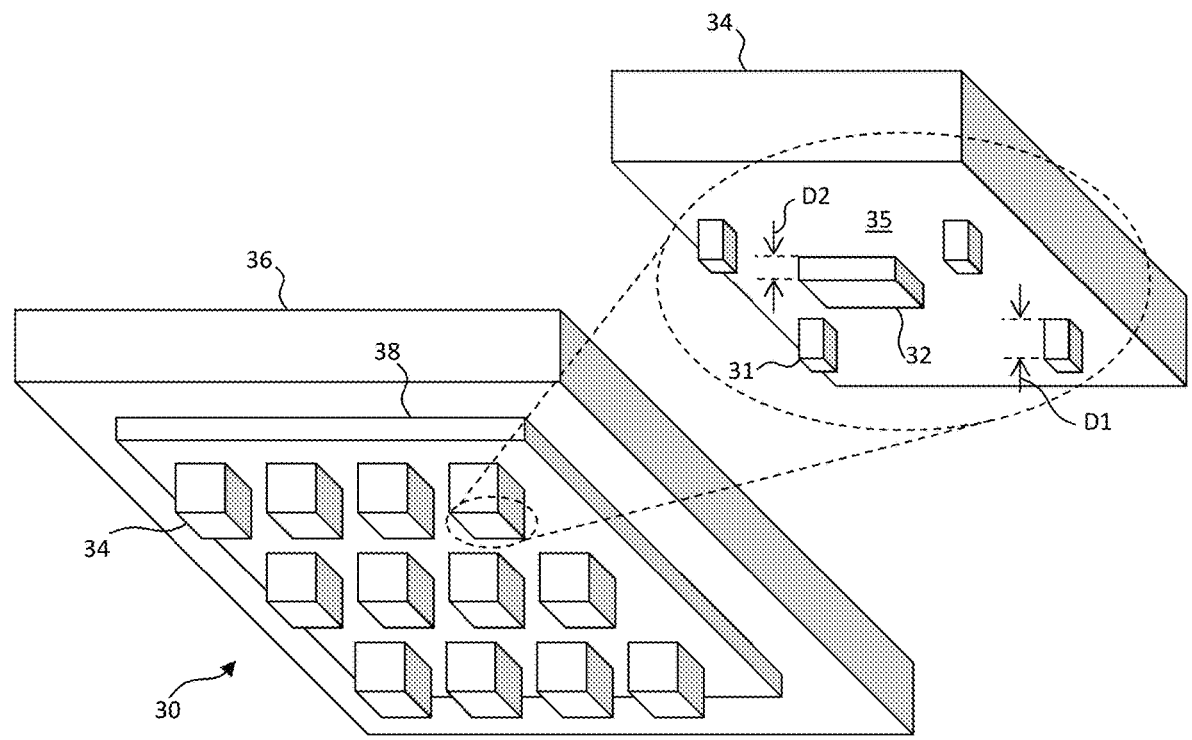
FIG. 1 is a perspective and detail of a stamp with posts having micro-posts according to illustrative embodiments of the present disclosure.

For clarity of illustration and understanding, the perspectives of FIGS. 7, 10, 11, 13, and 15 show stamps at different angles from a source wafer or target substrate so that both the posts and a surface of the source wafer or target substrate are exposed. Where cross sections A are present, the are congruent and show the alignment of the stamp with the source wafer or target substrate.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides, inter alia, structures and methods for micro-transfer printing components from a component source substrate to a target substrate. Embodiments of the present disclosure provide stamps that can pick up components from the component source wafer and print the components to the target substrate with improved yields.

According to some embodiments of the present disclosure and as shown in FIG. 1, a stamp 30 comprises a rigid support 36 (e.g., a rigid substrate, such as glass) and an array of posts 34 (e.g., stamp posts 34) disposed in combination with the rigid support 36. Each of the posts 34 in the array of posts 34 extends in a direction away from rigid support 36. A distal end 35 of each of posts 34 in the array of posts 34 has a structured three-dimensional surface comprising a first micro-post 31 that extends a first distance D1 away from rigid support 36 (or, stated alternatively, protrudes a first distance D1 from distal end 35) and a second micro-post 32 that extends a second distance D2 away from rigid support 36 (or, stated alternatively, protrudes a second distance D2 from distal end 35). Second distance D2 is less than first distance D1 so that first micro-post 31 extends farther from rigid support 36 than second micro-post 32. In some embodiments, posts 34 comprise multiple first micro-posts 31 or multiple second micro-posts 32, or both. Multiple first micro-posts 31 can extend different distances or the same distance (e.g., within manufacturing tolerances). Multiple second micro-posts 32 can extend different distances or the same distance (e.g., within manufacturing tolerances). In some embodiments, first micro-posts 31 extend at least a first distance D1 and second micro-posts 32 extend no more than a second distance D2, the first distance D1 greater than the second distance D2. Generic reference to micro-post(s) 33 may refer to first micro-post(s) 31, second micro-post(s) 32, or a combination of both first and second micro-posts 31, 32. The array of posts 34 can be disposed on a bulk layer 38 that is disposed on rigid support 36.

Rigid support 36 can be any rigid substrate, for example comprising glass, that provides a stable support for bulk layer 38 and posts 34. Posts 34 and micro-posts 33 can comprise an elastomeric, visco-elastic material, for example polydimethylsiloxane (PDMS), a relatively flexible material compared to a material of the rigid support 36. Visco-elastic materials exhibit rate-dependent adhesion so that, when in contact with the surface of a material (e.g., a surface of a device or component 20 as discussed further below), relatively rapid motion away from the material surface provides relatively strong adhesion between the visco-elastic material and the material surface and relatively slow motion away from the material surface provides relatively weak adhesion between the visco-elastic material and the material surface. Bulk layer 38 can comprise a same material as posts 34 and micro-posts 33, or a different material. In some embodiments, bulk layer 38 comprises the same materials as posts 34 but in different concentrations and can have a different Young's modulus than posts 34, for example as can be achieved with PDMS. Bulk layer 38, posts 34, and micro-posts 33 can be cast as a liquid material on or in a mold in contact with rigid support 36 and then cured and removed from the mold to make stamp 30. The mold can be made using photolithographic methods and materials, for example photolithographic processing of a wafer of silicon.

The array of posts 34 can be of any useful size, spacing, and arrangement on rigid support 36. Posts 34 are typically disposed in spatial alignment to facilitate printing a corresponding array of components 20 onto a component source wafer 10 (see FIGS. 7-15 described below). Micro-posts 33 of each post 34 are operable to contact a single component 20 so that each component 20 can adhere to micro-posts 33 on distal end 35 of post 34. Thus, multiple micro-posts 33 are a part of a single post 34 and micro-posts 33 of each single post 34 collectively contact a single, same, and common component 20. Distal end 35 of post 34 comprises micro-posts 33 (e.g., first and second micro-posts 31, 32) at an end of post 34 opposite bulk layer 38 or rigid support 36 and the proximal end of post 34 is adjacent to and in contact with bulk layer 38 or rigid support 36. In some embodiments, multiple posts 34 (including any of their micro-posts 33) are used to print a single component 20.

Figure 2:
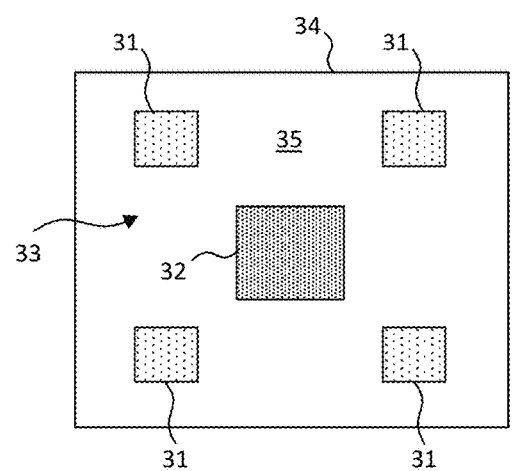
FIG. 2 is a plan view of the distal end of a post with micro-posts corresponding to FIG. 1 according to illustrative embodiments of the present disclosure.
Figure 3:
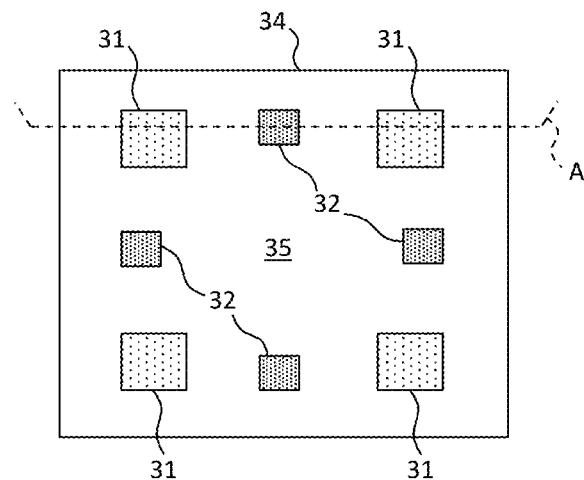
FIGS. 3-4 are plan views of the distal ends of posts with micro-posts according to illustrative embodiments of the present disclosure.
Figure 4:
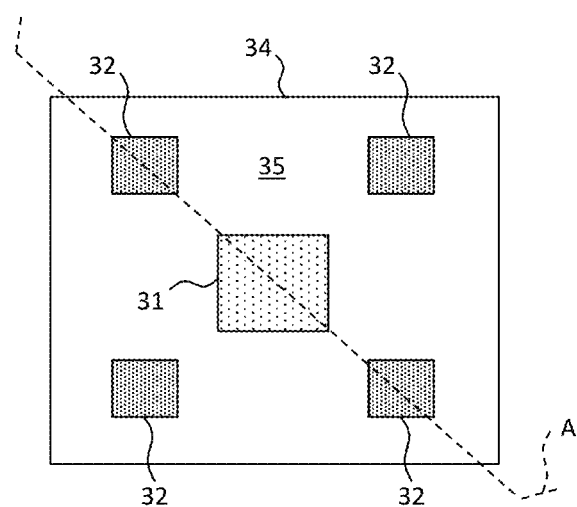
Figure 5:
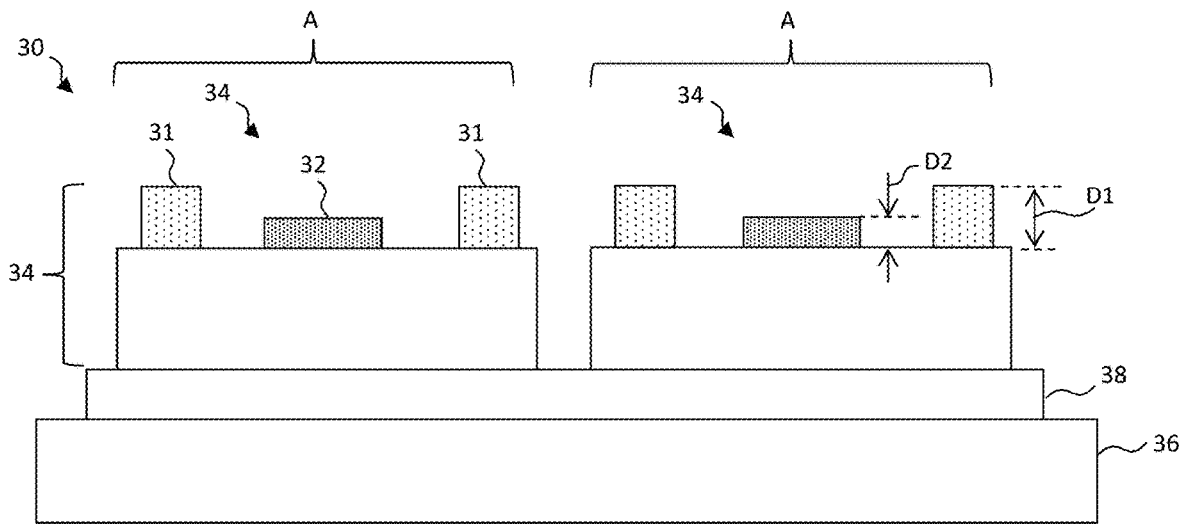
FIG. 5 is a cross section of a stamp and posts with micro-posts corresponding to a cross section of FIG. 3 taken along cross section line A according to illustrative embodiments of the present disclosure.

Micro-posts 33 can be disposed in a variety of configurations and arrangements in a structured three-dimensional surface on distal end 35 of posts 34. FIG. 2 illustrates an arrangement of micro-posts 33 on distal end 35 of posts 34 corresponding to FIG. 1. In such arrangements, the longer first micro-posts 31 are disposed around an outer periphery of distal end 35 of post 34, for example closer to edges or corners of distal end 35 of post 34 than to a center of distal end 35 of post 34, and shorter second micro-posts 32 are disposed closer to a center of distal end 35 of post 34 than to the outer perimeter (e.g., edges or corners) of distal end 35 of post 34. FIG. 3 and the corresponding cross section of FIG. 5 taken along cross section line A of FIG. 3 illustrates second micro-posts 32 disposed between first micro-posts 31 along edges (of an outer perimeter) of distal end 35 of post 34 and first micro-posts 31 disposed near corners (of an outer perimeter) of distal end 35 of post 34. FIG. 4 and the corresponding cross section of FIG. 6 taken along cross section line A of FIG. 4 illustrates some embodiments in which the shorter second micro-posts 32 are disposed around an outer periphery of distal end 35 of post 34, for example closer to edges or corners of distal end 35, of post 34 than to a center of distal end 35 of post 34, and longer first micro-posts 31 are disposed closer to a center of distal end 35 of post 34 than to the outer perimeter, for example edges or corners, of distal end 35 of post 34 (e.g., the locations of first and second micro-posts 31, 32 are reversed in comparison to the micro-posts 33 of FIG. 2). The choice of first and second micro-posts 31, 32 locations can be a matter of design choice, for example dependent on the size, shape, surface, and material of component 20 to be printed and the surface and material of target substrate 40 to which components 20 are micro-transfer printed (as discussed below with respect to FIGS. 7-15). Embodiments of the present disclosure are not limited by the illustrative examples of location, size, and shape shown in the Figures.

Figure 6:
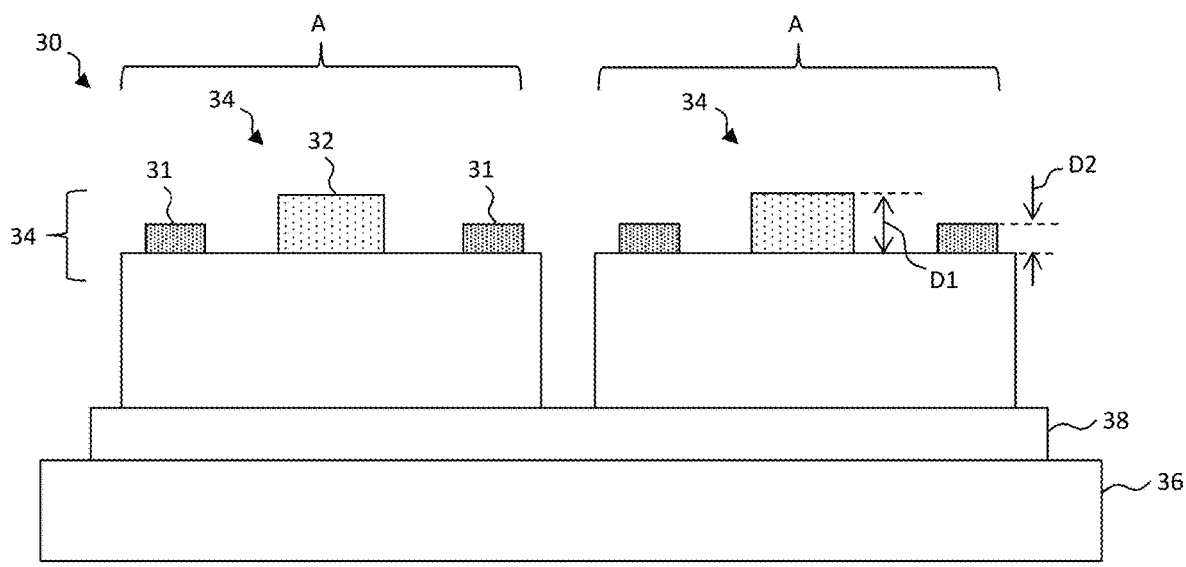
FIG. 6 is a cross section of a stamp and posts with micro-posts corresponding to a cross section of FIG. 4 taken along cross section line A according to illustrative embodiments of the present disclosure.

Micro-posts 33 on distal end 35 of posts 34 can vary in size and shape (e.g., area or cross section parallel to a surface on rigid support 36 or bulk layer 38 from which posts 34 extend). As shown in FIGS. 1-3 and 5, second micro-posts 32 have a larger area over distal end 35 than an area of first micro-posts 31 (e.g., second micro-posts 32 are wider or longer, or both than first micro-posts 31). As shown in FIGS. 4 and 6, first micro-posts 31 have a larger area over distal end 35 than an area of second micro-posts 32 (e.g., first micro-posts 31 are wider or longer, or both than second micro-posts 32). Micro-posts 33 with larger areas or cross sections can be disposed closer to a center of distal end 35 (as shown in FIGS. 1-6) or micro-posts 33 with larger areas can be disposed closer to an outer perimeter (e.g., corners or edges) of distal end 35. The choice of first and second micro-posts 31, 32 areas or shapes can be a matter of design choice, for example dependent on the size, shape, surface, and material of component 20 and the surface and material of target substrate 40 to which components 20 are micro-transfer printed (as discussed below with respect to FIGS. 7-15).

Figure 16:
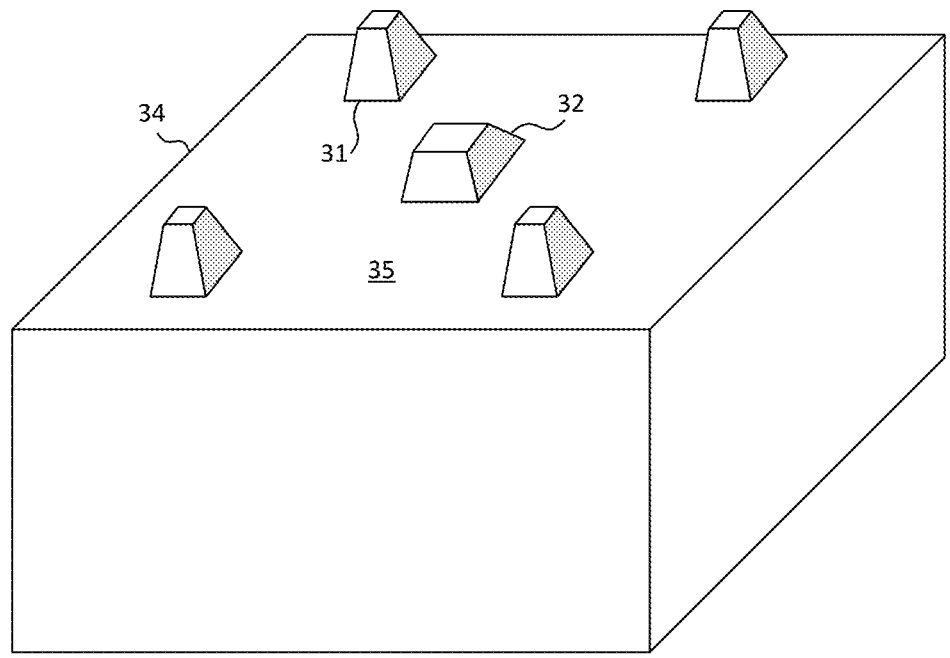
FIG. 16 is a perspective of a stamp post with micro-posts having a smaller area on the distal end than on the proximal ends according to illustrative embodiments of the present disclosure.
Figure 17:
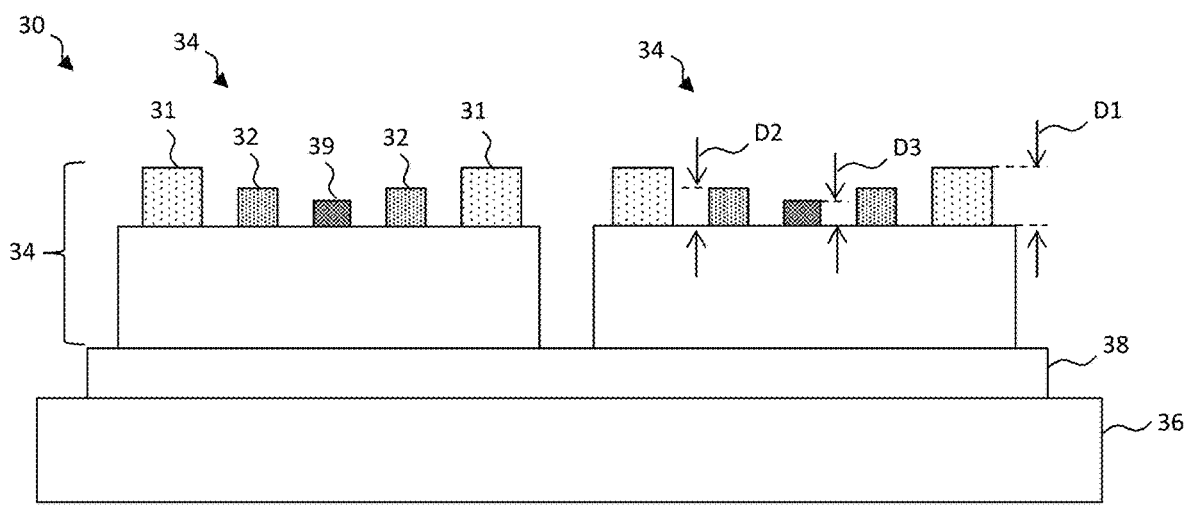
FIG. 17 is a cross section of a stamp post comprising three micro-posts having different heights according to illustrative methods of the present disclosure.

Micro-posts 33 can have a variety of aspect ratios and shapes. Micro-posts 33 can have a square, rectangular, circular, or oval distal surface as can posts 34 (the surface farthest from rigid support 36). In some embodiments, micro-posts 33 can have a distal surface that has a smaller area than a proximal surface closer to rigid support 36, for example as illustrated in FIG. 16. Micro-posts 33 can come to a point or sharp distal end 35, for example micro-posts 33 can have a tetrahedral or pyramidal structure. In some embodiments and as illustrated in FIG. 16, a third micro-post 39 on post 34 extends a third distance D3 less than second distance D2 away from rigid support 36. (First, second, and third micro-posts 31, 32, 39 are collectively micro-posts 33.) A choice of the number of micro-posts 33 with different heights, aspect ratios, and shapes can be a matter of design choice, for example dependent on the size, shape, surface, and material of component 20 and the surface and material of target substrate 40 to which components 20 are micro-transfer printed.

Figure 7:
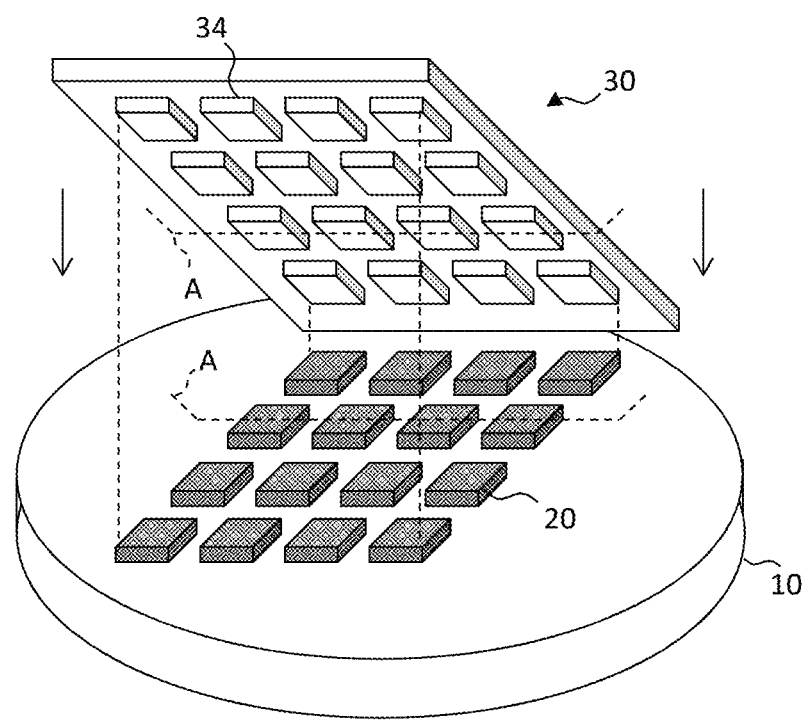
FIG. 7 is a perspective of a source wafer aligned with a stamp according to illustrative embodiments of the present disclosure.
Figure 8:
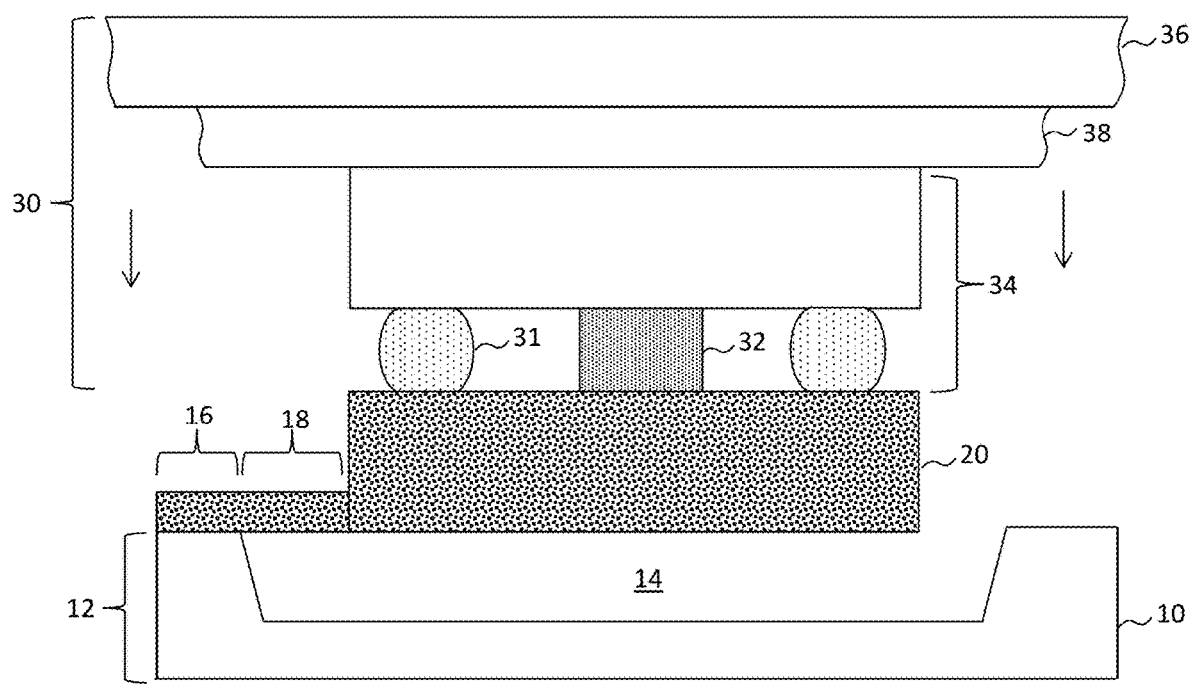
FIG. 8 is a cross section of a stamp with a post and compressed micro-posts contacting a component on a source wafer according to illustrative embodiments of the present disclosure.
Figure 9:
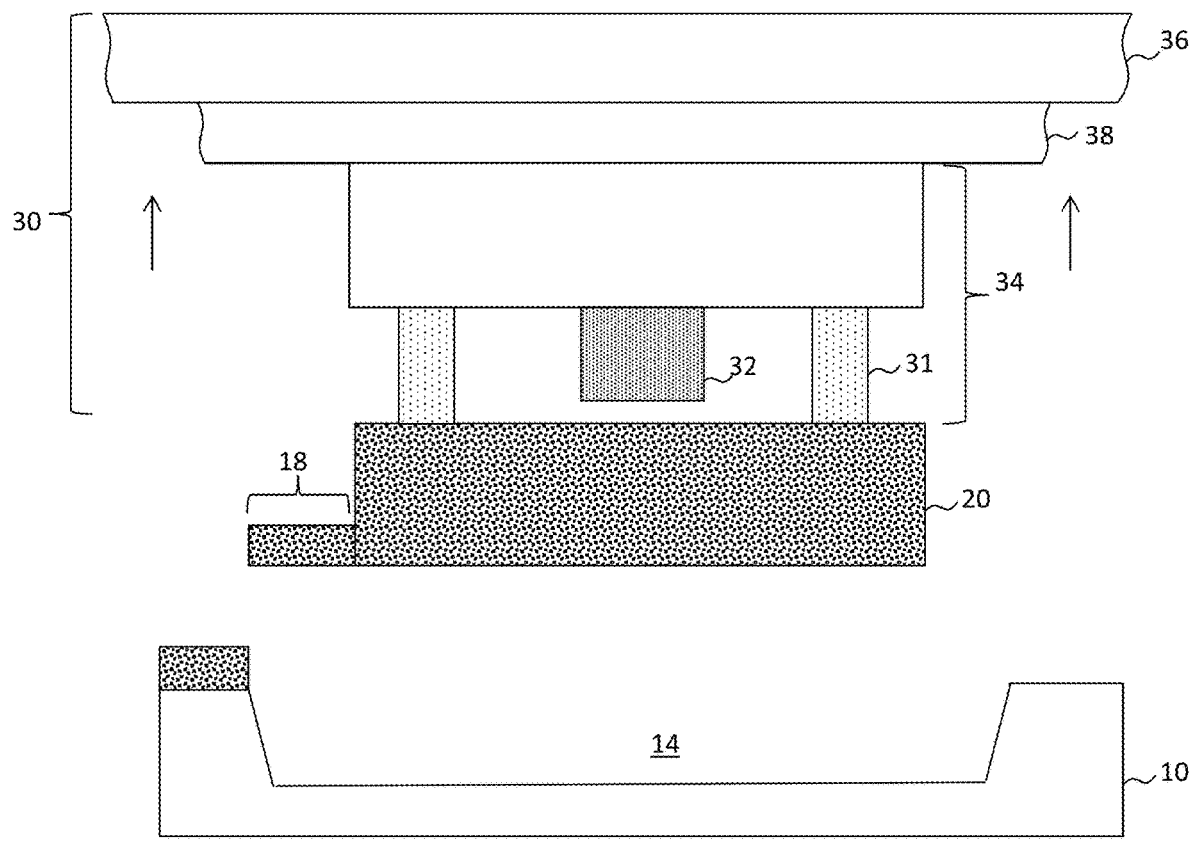
FIG. 9 is a cross section of a stamp with a post and relaxed micro-posts removing a component from a source wafer according to illustrative embodiments of the present disclosure.
Figure 10:
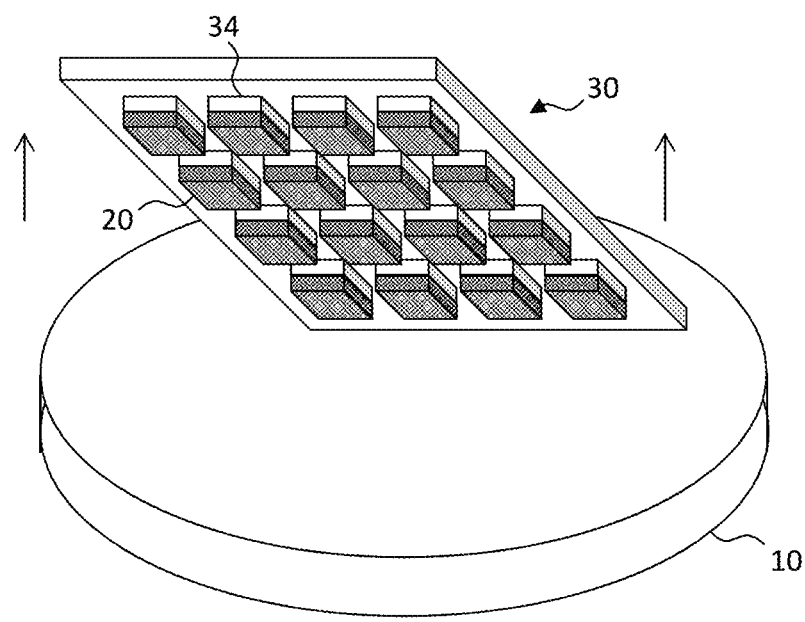
FIG. 10 is a perspective of a stamp with posts removing components from a source wafer corresponding to FIG. 9 according to illustrative embodiments of the present disclosure.
Figure 18:
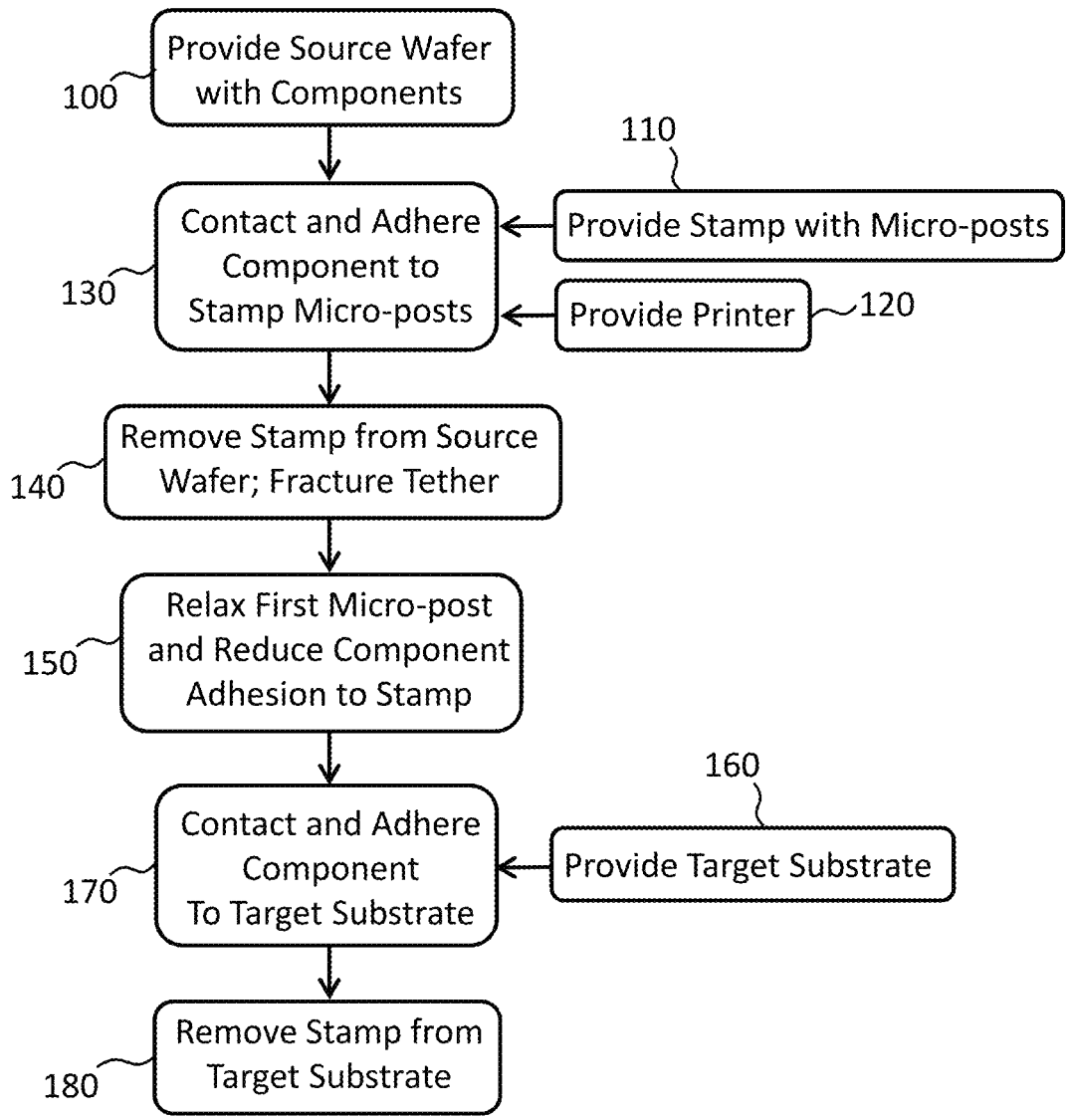
FIGS. 18 and 19 are flow diagrams according to illustrative methods of the present disclosure.
Figure 19:
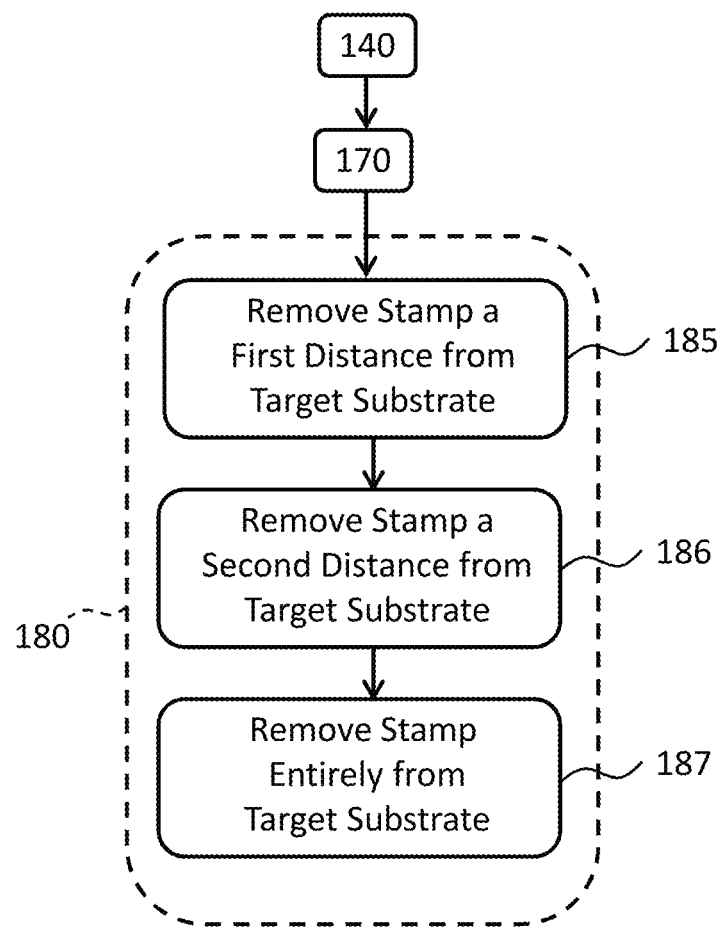

FIGS. 7-15 illustrate successive structures according to methods of the present disclosure as illustrated in the flow diagram of FIG. 18. As shown in FIG. 7 and FIG. 18, in step 100 a component source wafer 10 with components 20 disposed thereon is provided, in step 110 a stamp 30 with micro-posts 33 is provided, and in step 120 a printer is provided. Component source wafer 10 can be any suitable wafer or substrate for forming or disposing components 20, for example a semiconductor wafer. Component source wafer 10 can be a native source wafer on which components 20 are formed (e.g., epitaxially grown and/or photolithographically patterned). The printer can be any suitable mechanical device for locating and moving stamp 30 with respect to component source wafer 10 and target substrate 40, for example a mechatronic motion platform with optical alignment (e.g., through rigid support 36, body 38, and posts 32). As shown in FIG. 7, stamp 30 can be aligned with component source wafer 10 and components 20 with cross section lines A in a common position so that, in step 130 and as shown in FIG. 8, the printer can contact and adhere all of micro-posts 33 on post 34 to components 20. As shown in FIGS. 8-9, component source wafer 10 comprises a sacrificial layer 12 comprising sacrificial portions 14 separated by anchors 16. Each component 20 can be disposed exclusively and directly over sacrificial portion 14 so that, when sacrificial portion 14 is etched, components 20 are suspended over component source wafer 10 by tether 18.

Figure 11:
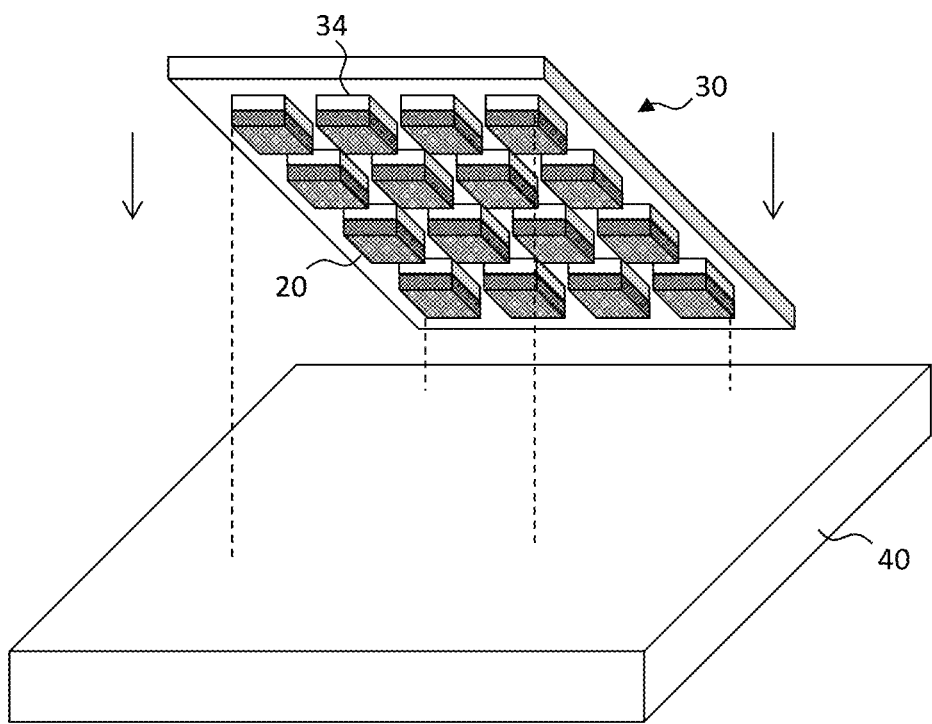
FIG. 11 is a perspective of a stamp with posts printing components to a target substrate according to illustrative embodiments of the present disclosure.
Figure 12:
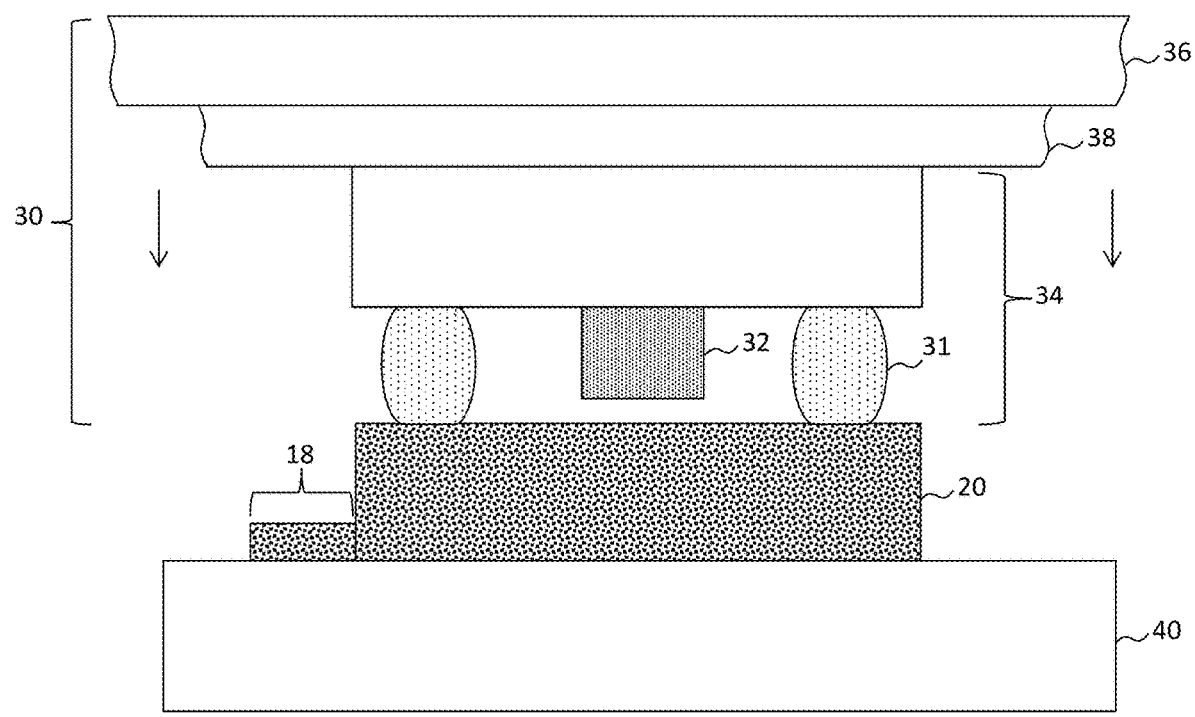
FIG. 12 is a cross section of a stamp with a post and compressed first micro-posts printing a component onto a target substrate according to illustrative embodiments of the present disclosure.
Figure 14:
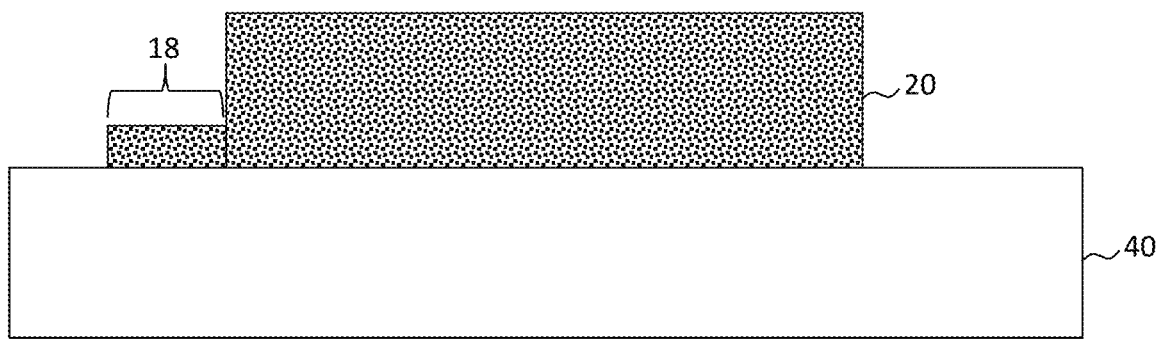
FIG. 14 is a cross section of a component on a target substrate according to illustrative embodiments of the present disclosure.
Figure 15:
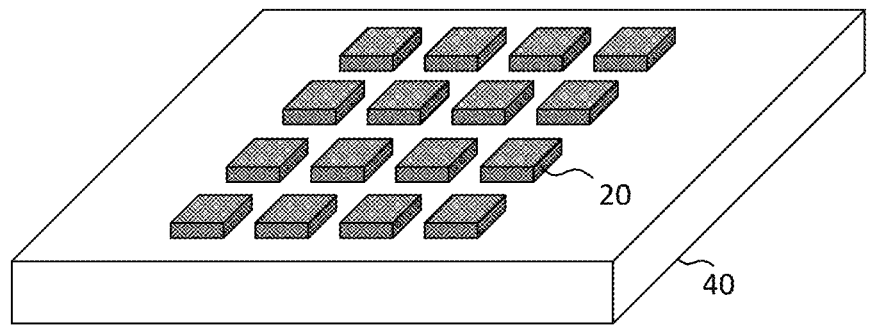
FIG. 15 is a perspective of components on a target substrate corresponding to FIG. 14 according to illustrative embodiments of the present disclosure.

In step 130 and as shown in FIG. 8, posts 34 are pressed against components 20 with sufficient pressure by moving stamp 30 towards component source wafer 10 a picking distance so that all of micro-posts 33 on each post 34 contacts a component 20 and at least first micro-post 31 is compressed, adhering components 20 to micro-posts 33 with a first adhesion (collectively across first micro-post(s) 31 and second micro-post(s) 32). The printer removes stamp 30 with components 20 in step 140 as shown in FIG. 9 and the perspective of FIG. 10, thereby breaking (e.g., fracturing) or separating tethers 18. Absent the pressure between stamp 30 and component source wafer 10, and as shown in FIG. 9, in step 150 first micro-posts 31 can relax and decompress, pressing against component 20 and causing separation of second micro-posts 32 from component 20, thereby reducing the adhesion between components 20 and posts 34. As shown in FIG. 11, the printer aligns stamp 30 with components 20 with a target substrate 40 (provided in step 160) and, in step 170 and as shown in FIG. 12, presses and contacts components 20 to target substrate 40 with first micro-posts 31 by moving stamp 30 towards component source wafer 10 a printing distance. The amount of pressure with which first micro-posts 31 presses components 20 against target substrate 40 can be less than the amount of pressure with which first micro-posts 31 were pressed against components 20 in step 130 by ensuring that the printing distance is less than the picking distance so that first micro-posts 31 are compressed but second micro-posts 32 are not compressed and do not re-contact component 20 so that a second adhesion between components 20 and micro-posts 33 (collectively across first micro-post(s) 32) remains reduced and is less than the first adhesion. Similarly, the amount of deformation of first micro-posts 31 during pick-up of components 20 can be greater than the amount of deformation of second micro-posts 32 during pick-up and, independently, greater than the amount of deformation of first micro-posts 31 during printing to target substrate 40. Once in contact with target substrate 40, components 20 adhere to target substrate 40. (Adherence can be enhanced, optionally, by using an adhesive with target substrate 40.) In step 180 and as shown in FIG. 12, stamp 30 is separated from components 20 and removed from target substrate 40 by the printer, for example at a slower separation rate than a separation rate used to remove components 20 from component source wafer 10, reducing the adhesion between micro-posts 33 and components 20. The second adhesion between posts 34 and components 20 on target substrate 40 compared to the first adhesion between posts 34 and components 20 on component source wafer 10 is further reduced because the contact area of micro-posts 33 is smaller, since second micro-posts 32 are no longer in contact with components 20. Thus, printing components 20 to target substrate 40 is facilitated and yields improved. In step 180, the printer removes stamp 30 from target substrate 40, leaving components 20 adhered to target substrate 40, as shown in FIGS. 14 and 15.

In some embodiments and as illustrated in FIGS. 19, and 20-24, the relaxation illustrated in step 150 need not detach second micro-posts 32 so that second micro-posts 32 continue to contact component 20 before printing components 20 to target substrate 40. When contacting components 20 to target substrate 40 by pressing posts 34 against components 20, second micro-posts 32 can contact components 20 (e.g., the printing distance can equal the picking distance or can even be larger), but the slower separation rate at which stamp 30 moves away from target substrate 40 enables second micro-posts 32 to first release at a first distance from component 20 at a first time before first micro-posts 31 releases from component 20 at a second time later than the first time and at a second distance from component 20 that is greater than the first distance.

Figure 20:
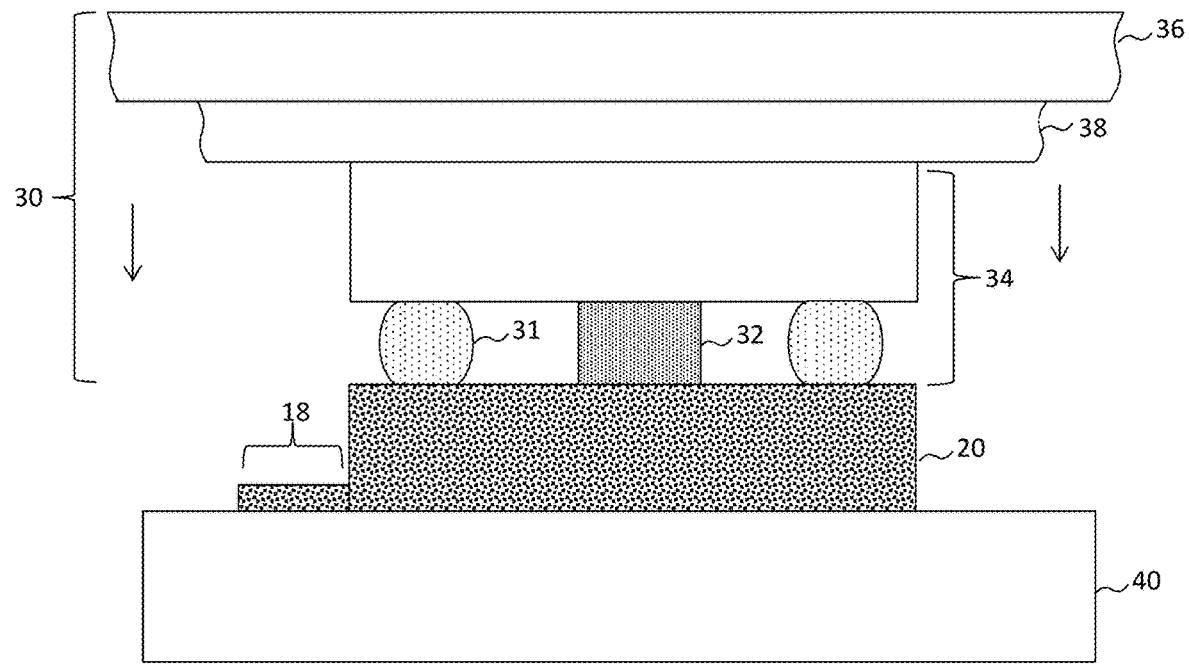
FIGS. 20-24 are successive cross sections of a stamp with a post and micro-posts printing a component onto a target substrate at a reduced separation rate according to illustrative embodiments of the present disclosure.
Figure 21:
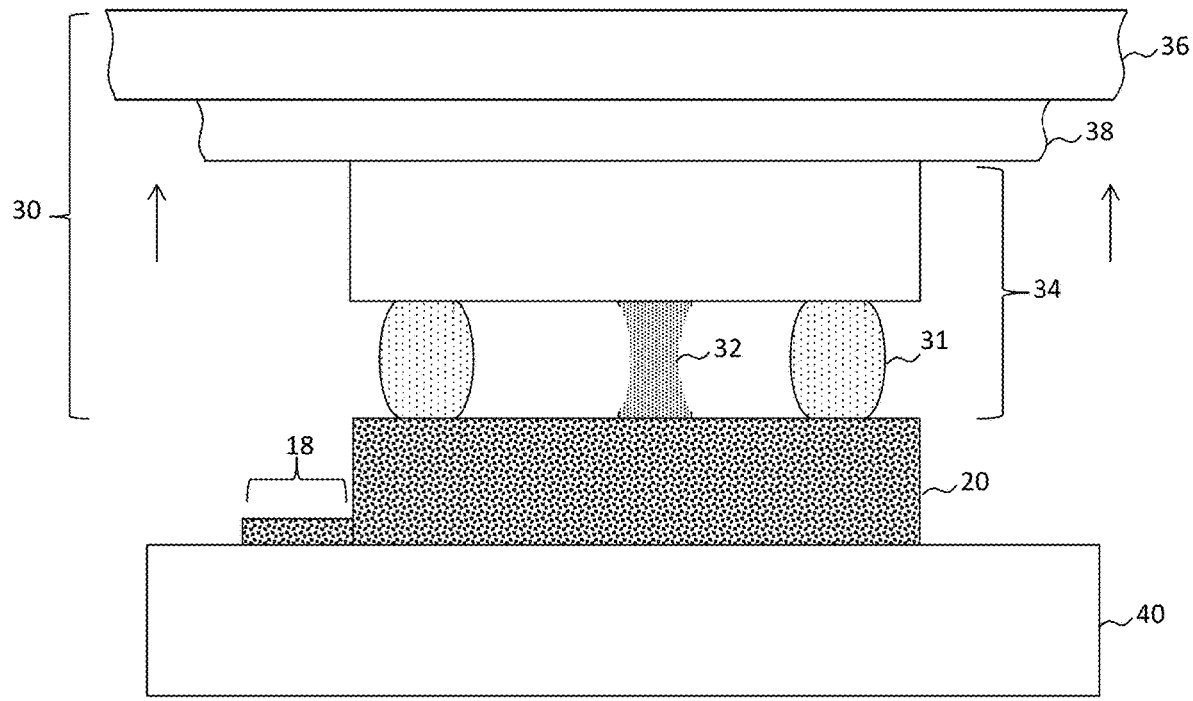
Figure 22:
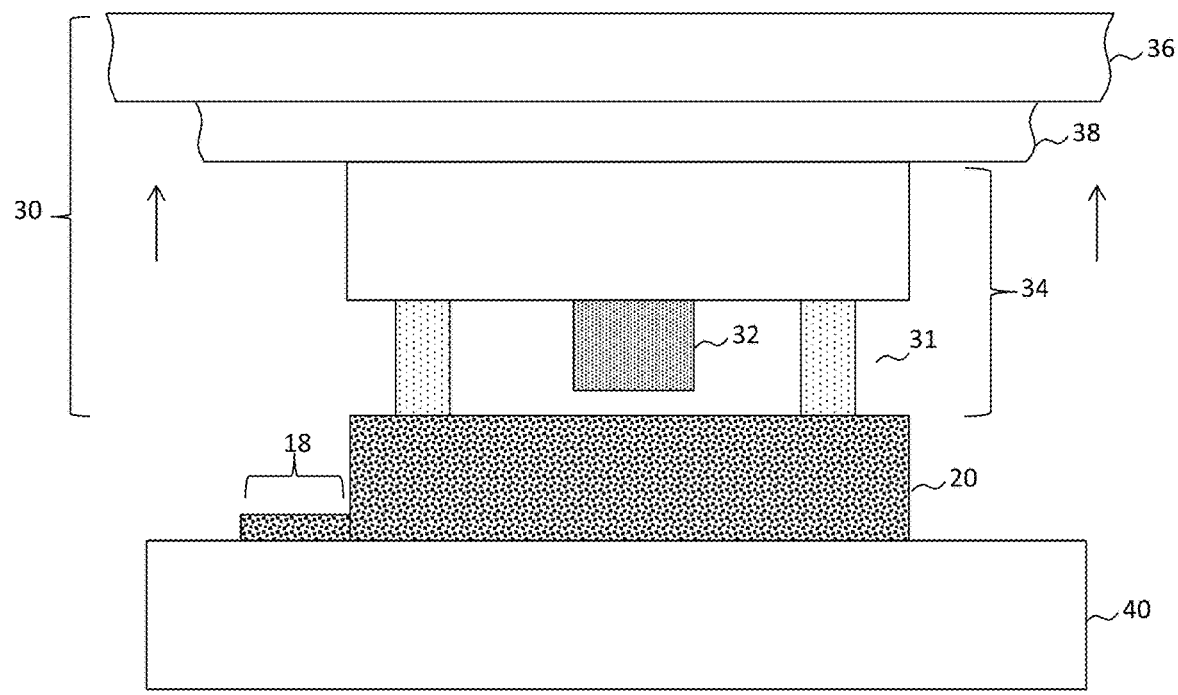

In such an embodiment and as shown in FIG. 20, in step 185 the print process for components 20 on target substrate 40 first contacts both first and second micro-posts 31, 32 to component 20 at the first distance and at a first time (and contacts component 20 to target substrate 40). In step 186 and as shown in FIGS. 21 and 22, at a second time after the first time, stamp 30 moves away from component 20 stretching second micro-posts 32 (as shown in FIG. 21). During this step, second micro-posts 32 experience a separation force but first micro-posts 31 do not because first micro-posts 31 are longer than second micro-posts 32. As the stamp is moved away from component 20 to the second distance, second micro-posts 32 are stretched at the same time that first micro-posts 31 are compressed as micro-posts 33 are moved from distance D2 to distance D1. Eventually, second micro-posts 32 detach from component 20 at a second distance greater than the first distance so only first micro-posts 31 contact component 20 (as shown in FIG. 22), reducing adhesion between micro-posts 33 and component 20.

Figure 13:
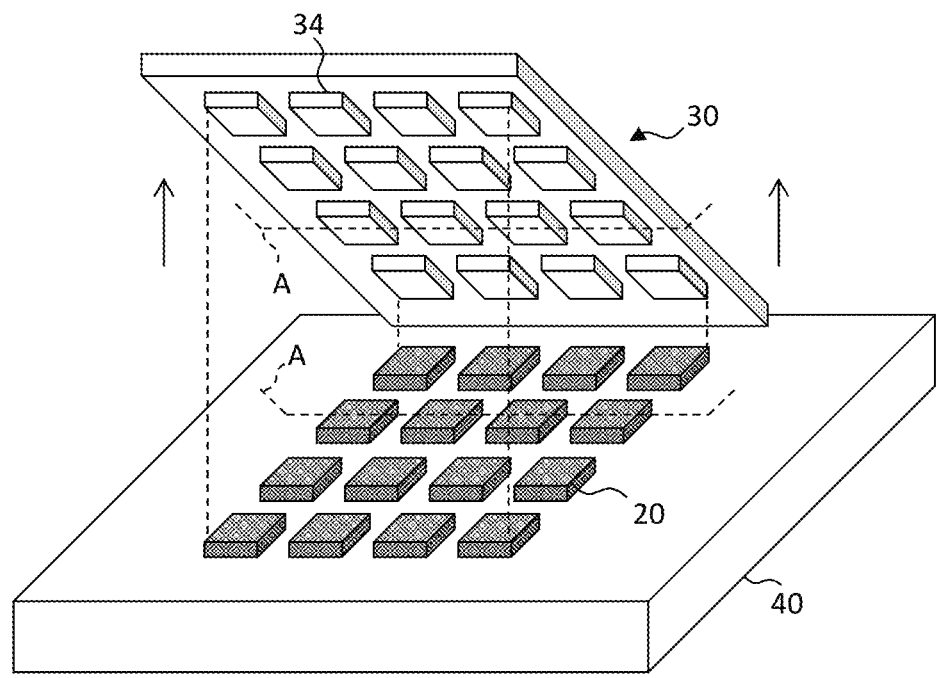
FIG. 13 is a perspective of a stamp with posts leaving components on a target substrate according to illustrative embodiments of the present disclosure.
Figure 23:
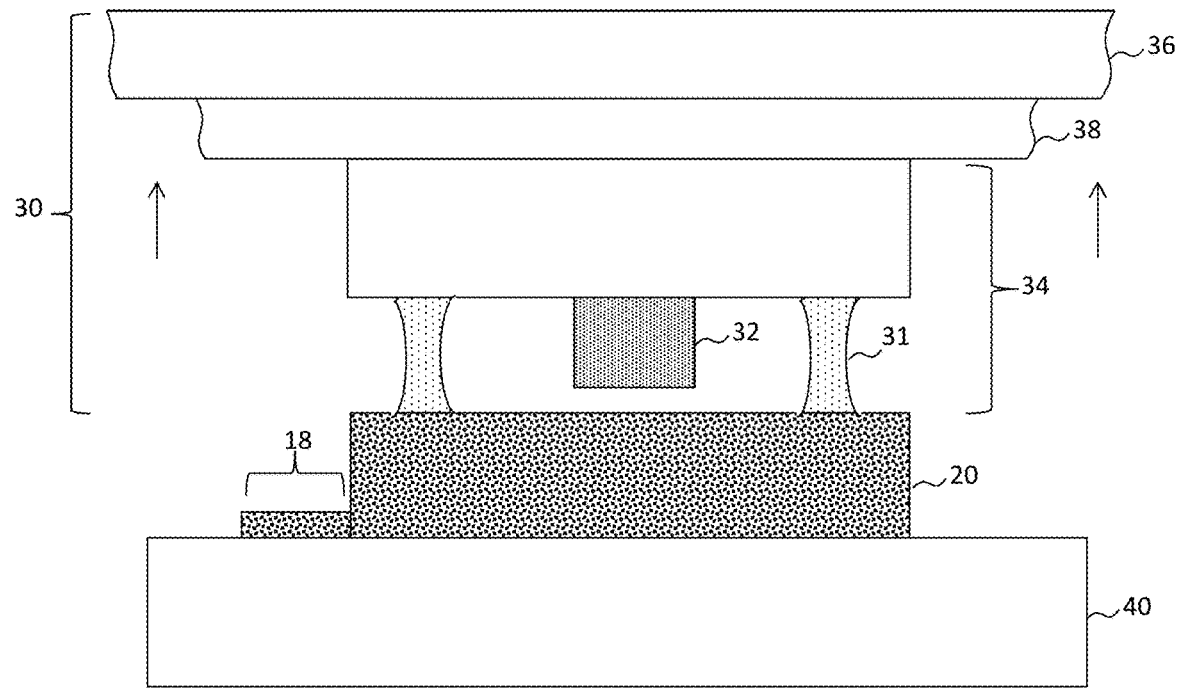
Figure 24:
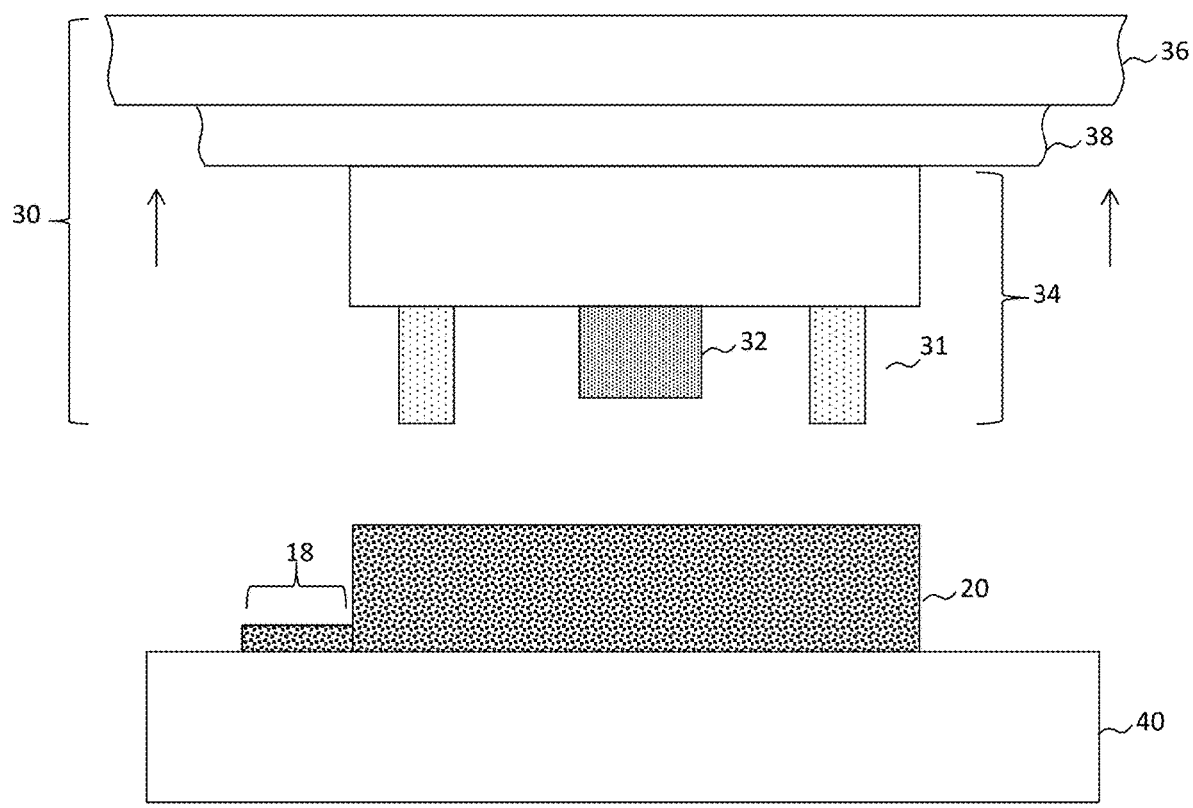

The process is then repeated for first micro-posts 31, first stretching micro-posts 31 (as shown in FIG. 23) and then detaching first micro-posts 31 from component 20 (as shown in FIG. 24). In step 187 and as shown in FIGS. 13-15, stamp 30, posts 34, and micro-posts 33 are removed entirely from component 20 on target substrate 40 in step 187 after detaching first micro-posts 31 from component 20.

This multi-step process is enabled by a slower separation rate movement of stamp 30 away from the component 20 on target substrate 40 than a faster movement of stamp 30 away from source wafer 10 with component 20. The slower movement (rate) first reduces the number of micro-posts 33 and adhesion between micro-posts 33 and component 20 in a first step (e.g., step 185 detaches second micro-posts 32 from component 20) before completely detaching micro-posts 33 from component 20 in a second step, e.g., step 186. The second step has reduced adhesion between micro-posts 33 and component 20 because the area of micro-posts 33 in contact with component 20 is reduced (because second micro-posts 32 are no longer adhered to component 20) and because the rate at which stamp 30 is moved away from target substrate 40 is reduced, reducing adhesion due to the rate-dependent adhesive nature of visco-elastic elastomeric materials.

In some embodiments, an adhesive layer is provided on target substrate 40 to enhance adhesion between components 20 and target substrate 40. However, in some applications such an adhesive layer is undesirable or impractical so that printing to the target substrate 40 is more difficult. Using micro-posts 33 as in embodiments of the present disclosure can enable or facilitate printing to target substrate 40 without any adhesive layer.

According to some embodiments of the present disclosure, a micro-transfer-printing stamp 30 comprises components 20 disposed on distal end 35 of posts 34 and in contact with at least one micro-post 33 of each post 34. According to some embodiments of the present disclosure, components 20 are physically attached to anchor 16 with tether 18 exclusively and directly over sacrificial portions 14 suspended over component source wafer 10 and adhered to posts 34 and micro-posts 33 of stamp 30. According to some embodiments of the present disclosure, components 20 with fractured tethers 18 are disposed on and adhered to target substrate 40 and adhered to posts 34 and micro-posts 33 of stamp 30.

Components 20 according to embodiments of the present disclosure can be micro-components 20 and posts 34 can be correspondingly small. For example, components 20 can have a length or width, or both, no greater than 200 microns, no greater than 100 microns, no greater than 50 microns, no greater than 20 microns, no greater than 10 microns, no greater than 5 microns, or no greater than 2 microns. The thickness of components 20 can be no greater than 50 microns, no greater than 20 microns, no greater than 10 microns, no greater than 5 microns, no greater than two microns, no greater than one micron, or no greater than 0.5 microns. Posts 34 can have a distal end 35 with an area similar to the area (length by width) of components 20, somewhat smaller, or somewhat larger. The area of micro-posts 33 (farthest from rigid support 36 or protruding farthest from distal end 35) can have an area no greater than the area of components 20, for example no greater than 80%, no greater than 50%, or no greater than 25% of distal end 35.

The height of posts 34 can be, for example, 10-50 microns and the height of micro-posts 33 can be, for example 5-25 microns. The difference in height between first and second micro-posts 31, 32 can be at least or no greater than two microns, at least or no greater than five microns, at least or no greater than ten microns, at least or no greater than fifteen microns, or at least or no greater than twenty microns. The desired heights can depend on component 20 size, the Young's modulus of the micro-post 33 and post 34 material, and the rate at which stamp 30 will be moved with respect to component source wafer 10 or target substrate 40. Useful embodiments have been demonstrated experimentally with pick and print distance differences of 5 to 25 microns, and frequently around 10 microns.

The positions and movements of stamps 30, component source wafer 10, and target substrate 40 can be controlled by a motion platform (e.g., a 2D or 3D motion platform controlling horizontal, vertical, and rotational movement and alignment) of a printer. For example, stamp 30, component source wafer 10, and target substrate 40 can be in contact with, and their movements controlled by, the motion platform of the printer. A motion platform of the printer can be a mechatronic system that uses an optical camera to align stamp 30 to component source wafer 10, components 20, and target substrate 40. Embodiments are described herein as moving stamp 30 towards source wafer 10 to pick up components or toward target substrate 40 to print components; analogous embodiments where source wafer 10 is moved towards stamp 30 during pick-up or target substrate 40 is moved towards stamp 30 during printing, or both, are also contemplated. Generically, moving one of stamp 30, source wafer 10, and target substrate 40 towards another of stamp 30, source wafer 10, and target substrate 40 is referred to as moving them "together." Any such movements can be performed with an appropriately constructed printer.

Bulk layer 38 can comprise a same material as posts 34 and can be equally flexible (e.g., have a common Young's modulus). In some embodiments, bulk layer 38 comprises the same material(s) as posts 34 but in different proportions, so that posts 34 are more flexible than bulk layer 38. In some embodiments, bulk layer 38 comprises different materials than posts 34 and posts 34 are more flexible than bulk layer 38 (e.g., have a lower Young's modulus). According to some embodiments, bulk layer 38 can comprise a common bulk layer 38 or comprise separate bulk layers 38 each supporting a subset of posts 34. Rigid support 36 can be, for example, any suitable wafer or rigid structure with a substantially planar surface suitable for processing, for example glass, silicon, sapphire, or quartz. Rigid support 36 is less flexible than bulk layer 38 and less flexible than posts 34.

Substrate 10 can be a source wafer 10 (e.g., a component source wafer 10 or native component source wafer 10) and each component 20 can be disposed completely and entirely over sacrificial portion 14. Component source wafer 10 can comprise a sacrificial layer 12 comprising sacrificial portions 14 laterally separated by anchors 16. Components 20 can be physically connected to anchors 16 by tethers 18. In some embodiments, sacrificial portions 14 are sacrificed, for example by dry or wet etching, so that sacrificial material in sacrificial portions 14 is removed to form a gap (as shown in FIGS. 8 and 9).

In certain embodiments, component source wafer 10 (substrate 10) can be any structure with a surface suitable for forming patterned sacrificial layers 12, sacrificial portions 14 (or an etched gap), anchors 16, tethers 18, and disposing or forming patterned components 20. For example, component source wafers 10 can comprise a semiconductor or compound semiconductor and can comprise an etchable sacrificial layer 12 comprising material different (e.g., an oxide) from material of component source wafer 10. Any one or more of component source wafer 10, sacrificial layer 12, and sacrificial portion 14 can comprise an anisotropically etchable material. Suitable semiconductor materials can be silicon or silicon with a (100) crystal structure (e.g., orientation). A surface of component source wafer 10 can be substantially planar and suitable for photolithographic processing, for example as found in the integrated circuit or MEMs art.

Component 20 can be encapsulated by an encapsulation layer to protect components 20 from environmental contaminants. The encapsulation layer can also coat portions of sacrificial layer 12 or component source wafer 10 and anchors 16. In some embodiments, tether 18 comprises portions of an encapsulation layer or a portion of an encapsulation layer forms tether 18. Component 20 can comprise an encapsulation layer and tether 18 or a portion (e.g., fractured or separated portion) of tether 18.

In some embodiments of the present disclosure, components 20 are small integrated circuits or micro-electromechanical (MEMS) devices, for example chiplets (e.g., micro-chiplets). Component 20 can have any suitable aspect ratio or size in any dimension and any useful shape, for example a rectangular cross section or rectangular top or rectangular bottom surface. Components 20 can be microcomponents 20, for example having at least one dimension that is in the micron range, for example having a planar extent from 2 microns by 5 microns to 200 microns by 500 microns (e.g., an extent of 2 microns by 5 microns, 20 microns by 50 microns, or 200 microns by 500 microns) and, optionally, a thickness of from 200 nm to 200 microns (e.g., at least or no more than 2 microns, 20 microns, or 200 microns). Components 20 can have a thin substrate with at least one of (i) a thickness of only a few microns, for example less than or equal to 25 microns, less than or equal to 15 microns, or less than or equal to 10 microns, (ii) a width of 5-1000 microns (e.g., 5-10 microns, 10-50 microns, 50-100 microns, or 100-1000 microns) and (iii) a length of 5-1000 microns (e.g., 5-10 microns, 10-50 microns, 50-100 microns, or 100-1000 microns).

Such micro-components (components 20) can be made in a native source semiconductor wafer (e.g., a silicon wafer or compound semiconductor wafer such as component source wafer 10) having a process side and a back side used to handle and transport the wafer using lithographic processes. Components 20 can be formed using lithographic processes in an active layer on or in the process side of component source wafer 10. Methods of forming such structures are described, for example, in U.S. Pat. No. 8,889,485. According to some embodiments of the present disclosure, component source wafers 10 can be provided with components 20, sacrificial layer 12 (a release layer), sacrificial portions 14, anchors 16, and tethers 18 already formed, or they can be constructed as part of a process in accordance with certain embodiments of the present disclosure.

In certain embodiments, components 20 can be constructed using foundry fabrication processes used in the art. Layers of materials can be used, including materials such as metals, oxides, nitrides and other materials used in the integrated-circuit art. Components 20 can have different sizes, for example, less than 1000 square microns or less than 10,000 square microns, less than 100,000 square microns, or less than 1 square mm, or larger. Components 20 can have variable aspect ratios, for example at least 1:1, at least 2:1, at least 5:1, or at least 10:1. Components 20 can be rectangular or can have other shapes.

A component 20 can be an active circuit component 20, for example including one or more active electronic elements such as electronic transistors or diodes or light-emitting diodes or photodiodes that produce an electrical current in response to ambient light. A component 20 can be a passive component 20, for example including one or more passive elements such as resistors, capacitors, or conductors. In some embodiments, a component 20 includes both active and passive elements. A component 20 can be a semiconductor device having one or more semiconductor layers, such as an integrated circuit. A component 20 can be an unpackaged die. In some embodiments, a component 20 is a compound device having a plurality of active or passive elements, such as multiple semiconductor components 20 with separate substrates, each with one or more active elements or passive elements, or both. Components 20 can be or include, for example, electronic processors, controllers, drivers, light-emitting diodes, photodiodes, light-control devices, light-management devices, piezoelectric devices, acoustic wave devices (e.g., acoustic wave filters), optoelectronic devices, electromechanical devices (e.g., microelectromechanical devices), photovoltaic devices, sensor devices, photonic devices, magnetic devices (e.g., memory devices), or elements thereof.

Some illustrative embodiments described herein included description of a single component 20 being printed using a single post 34. It is contemplated that arrays of such posts 34 can be included to print several (e.g., many) components 20 simultaneously. For example, an array of posts 34 can include at least 100, at least 1000, at least 10,000, or at least 50,000 posts 34 that can print multiple components 20 at a time (e.g., in a one-to-one post-to-component correspondence), where the posts 34 each include a distal end 35 having a structured three-dimensional surface comprising one or more first micro-posts 31 and one or more second micro-posts 32 as described herein.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

A cross section
D1 first distance

D2 second distance
D3 third distance
10 substrate/source wafer/component source wafer
12 sacrificial layer
14 sacrificial portion/sacrificial material/gap
16 anchor
18 tether
20 component/micro-component
30 stamp
31 first micro-post
32 second micro-post
33 micro-posts
34 post
35 distal end
36 rigid support/rigid substrate
38 bulk layer
39 third micro-post
40 target substrate
100 provide source wafer with components step
110 provide stamp with micro-posts step
120 provide printer step
130 contact and adhere components to micro-posts step
140 remove stamp from source wafer and fracture tether step
150 relax first micro-post and reduce component adhesion to stamp step
160 provide target substrate step
170 contact and adhere component to target substrate step
180 remove stamp from target substrate step

The invention claimed is:

1. A micro-transfer-printing stamp, comprising:
a rigid support; and
an array of posts disposed over the rigid support, each of the posts in the array of posts extending in a direction away from the rigid support,
wherein, for each post in the array of posts, a distal end of the post has a structured three-dimensional surface comprising a first micro-post that extends a first distance away from the rigid support and a second micro-post that extends a second distance away from the rigid support, the second distance less than the first distance, and
wherein the posts in the array of posts comprise an elastomeric material.

2. The micro-transfer-printing stamp of claim 1, comprising an elastomeric bulk layer disposed on the rigid support, wherein the array of posts is disposed on the elastomeric bulk layer.

3. The micro-transfer-printing stamp of claim 1, wherein the structured three-dimensional surface comprises a third micro-post that extends a third distance away from the rigid support, the third distance less than the second distance.

4. The micro-transfer-printing stamp of claim 1, wherein, for each post in the array of posts, the structure three-dimensional surface of the post comprises a plurality of first micro-posts that extend at least the first distance away from the rigid support.

5. The micro-transfer-printing stamp of claim 4, wherein the post has an outer perimeter and a center and the first micro-posts are closer to the outer perimeter than to the center.

6. The micro-transfer-printing stamp of claim 4, wherein the post has an outer perimeter and a center and the first micro-posts are closer to the center than to the outer perimeter.

7. The micro-transfer-printing stamp of claim 4, wherein the post has an outer perimeter and the first micro-posts are closer to the outer perimeter than to the second micro-post.

8. The micro-transfer-printing stamp of claim 4, wherein the post has an outer perimeter and a center wherein the first micro-posts are disposed around the perimeter and the second micro-post is disposed closer to the center than to the first micro-posts.

9. The micro-transfer-printing stamp of claim 1, wherein, for each post in the array of posts, the structured three-dimensional surface comprises a plurality of second micro-posts that extend no more than the second distance away from the rigid support.

10. The micro-transfer-printing stamp of claim 9, wherein the post has an outer perimeter and a center and the second micro-posts are closer to the outer perimeter than to the center.

11. The micro-transfer-printing stamp of claim 9, wherein the post has an outer perimeter and a center and the second micro-posts are closer to the center than to the outer perimeter.

12. The micro-transfer-printing stamp of claim 9, wherein the post has an outer perimeter and the second micro-posts are closer to the outer perimeter than the first micro-posts.

13. The micro-transfer-printing stamp of claim 1, wherein the first micro-post has a first shape and the second micro-post has a second shape, and the first shape is different from the second shape.

14. The micro-transfer-printing stamp of claim 1, wherein the first micro-post has a first contact area and the second micro-post has a second contact area, and the first contact area is different from the second contact area.

15. The micro-transfer-printing stamp of claim 1, wherein the first micro-post is no greater than fifteen microns longer than the second micro-post.

16. The micro-transfer-printing stamp of claim 1, comprising a respective component adhered to the first micro-post of each post in the array of posts.

17. A source substrate system, comprising:
a source substrate comprising a sacrificial layer comprising sacrificial portions separated by anchors; and
a micro-transfer-printing stamp according to claim 1,
wherein each of a plurality of components is physically attached to an anchor of the anchors with a tether and is disposed exclusively and directly over a sacrificial portion of the sacrificial portions, and the components are adhered to the first micro-post of posts in the array of posts.

18. A target substrate system, comprising:
a target substrate;
components; and
a micro-transfer-printing stamp according to claim 1,
wherein the components are adhered to the target substrate, each of the components comprises a broken or separated tether, and the components are adhered to first micro-post of posts in the array of posts.

19. A method of micro-transfer printing, comprising:
providing a source wafer comprising a sacrificial layer comprising a sacrificial portion adjacent to an anchor and a component physically attached to the anchor with a tether, the component disposed exclusively and directly over the sacrificial portion;
providing a micro-transfer printing stamp according to claim 1;
providing a target substrate;

providing a printer operable to move at least the stamp with respect to (i) the source wafer and (ii) the target substrate;

contacting the first micro-post and the second micro-post of one of the posts in the array of posts to the component by moving the stamp and the component together a picking distance with the printer to adhere the component to the first micro-post and to the second micro-post collectively with a first adhesion;

removing the component from the source wafer with the printer, thereby breaking or separating the tether;

allowing the first micro-post to relax such that the second micro-post separates from the component such that the component is adhered to the first micro-post with a second adhesion less than the first adhesion; and contacting the component to the target substrate by moving the stamp and the target substrate together a printing distance with the printer to adhere the component to the target substrate with a print adhesion greater than the second adhesion, wherein the printing distance is less than the picking distance.

20. The method of claim 19, wherein the component is removed from the source wafer at a first rate and the method comprises removing the stamp from the component at a second rate less than the first rate such that the component remains on the target substrate.

\* \* \* \* \*